United States Patent
Pinter (10) Patent No.: US 11,479,461 B2
(45) Date of Patent: Oct. 25, 2022

(54) PRODUCTION METHOD FOR A MICROMECHANICAL DEVICE HAVING INCLINED OPTICAL WINDOWS, AND MICROMECHANICAL DEVICE HAVING INCLINED OPTICAL WINDOWS

(71) Applicant: Robert Bosch GmbH, Stuttgart (DE)

(72) Inventor: Stefan Pinter, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 170 days.

(21) Appl. No.: 17/056,686

(22) PCT Filed: May 11, 2019

(86) PCT No.: PCT/EP2019/062109
§ 371 (c)(1),
(2) Date: Nov. 18, 2020

(87) PCT Pub. No.: WO2020/011422
PCT Pub. Date: Jan. 16, 2020

(65) Prior Publication Data
US 2021/0198102 A1    Jul. 1, 2021

(30) Foreign Application Priority Data

Jul. 11, 2018   (DE) ......................... 102018211548.6

(51) Int. Cl.
*B81C 1/00* (2006.01)
*B81B 7/00* (2006.01)
*G02B 26/08* (2006.01)

(52) U.S. Cl.
CPC ...... *B81C 1/00317* (2013.01); *B81C 1/00626* (2013.01); *B81B 7/0067* (2013.01);
(Continued)

(58) Field of Classification Search
CPC .......... B81B 2201/04; B81B 2201/042; B81B 2201/047; B81B 7/0067;
(Continued)

(56) References Cited

U.S. PATENT DOCUMENTS

| 6,700,138 B2 * | 3/2004 | Crane, Jr. ............ G02B 6/4244 257/692 |
| 10,678,046 B2 * | 6/2020 | Ghahremani ....... B81C 1/00269 |

(Continued)

FOREIGN PATENT DOCUMENTS

| DE | 102012217793 A1 | 4/2014 |
| DE | 102016217817 A1 | 3/2018 |

(Continued)

OTHER PUBLICATIONS

International Search Report for PCT/EP2019/062109, dated Aug. 21, 2019.

*Primary Examiner* — Shahed Ahmed
*Assistant Examiner* — Sun Mi Kim King
(74) *Attorney, Agent, or Firm* — Norton Rose Fulbright US LLP; Gerard Messina (57) ABSTRACT

A production method for a micromechanical device having inclined optical windows. First and second substrates are provided. A plurality of through-holes is produced in the first and second substrate such that for each through-hole in the first substrate a congruent through-hole is produced in the second substrate, which overlap when the first substrate is placed over the second substrate. A slanted edge region is produced around a respective through-hole in the first and second substrate, the edge region being inclined at a window angle, two slanted edge regions situated on top of each other being congruent in a top view and being inclined at the same window angle. A window foil is provided having a structured window region, which covers the through-hole in a top view of the window foil in each case, the window foil (Continued)

forming an optical window slanted at the window angle above the respective through-hole.

14 Claims, 4 Drawing Sheets

(52) U.S. Cl.
CPC . *B81B 2201/047* (2013.01); *B81B 2203/0384* (2013.01); *G02B 26/0833* (2013.01)

(58) Field of Classification Search
CPC ........ B81B 2203/0384; B81C 1/00317; B81C 1/00626; G02B 26/0833
See application file for complete search history.

(56) References Cited

U.S. PATENT DOCUMENTS

| | | | |
|---|---|---|---|
| 11,081,413 B2* | 8/2021 | Wu | ................. H01L 23/04 |
| 2007/0024549 A1 | 2/2007 | Choi et al. | |
| 2010/0014147 A1* | 1/2010 | Pinter | ................. B81B 7/0067 359/290 |
| 2010/0330332 A1* | 12/2010 | Quenzer | ............... B81B 7/0067 65/106 |
| 2012/0133004 A1* | 5/2012 | Pinter | ................. B81C 1/00103 257/416 |
| 2012/0140306 A1* | 6/2012 | Pinter | ................. B81B 7/0067 29/428 |
| 2015/0200105 A1 | 7/2015 | Langa et al. | |
| 2015/0232328 A1* | 8/2015 | Armbruster | ............. B81C 3/001 438/691 |
| 2018/0065845 A1* | 3/2018 | Steuer | ................. B81C 1/00626 |
| 2018/0113300 A1* | 4/2018 | Pinter | ................. G02B 27/0006 |

FOREIGN PATENT DOCUMENTS

| | | |
|---|---|---|
| JP | 2001330751 A | 11/2001 |
| JP | 2003202613 A | 7/2003 |
| JP | 2011517626 A | 6/2011 |
| JP | 2018041084 | 3/2018 |

\* cited by examiner

PRODUCTION METHOD FOR A MICROMECHANICAL DEVICE HAVING INCLINED OPTICAL WINDOWS, AND MICROMECHANICAL DEVICE HAVING INCLINED OPTICAL WINDOWS

The present invention relates to a production method for a micromechanical device having inclined optical windows and to a micromechanical device having inclined optical windows.

BACKGROUND INFORMATION

Generally, MEMS components require a protective device in order to protect them from harmful external influences by particles or the like, so that the component is protected from mechanical contact and is also able to be processed, e.g., singulated from the wafer composite in chips by sawing without sustaining damage. Protective devices having optical windows frequently have boundary surfaces at the windows where undesired reflections may occur. If such local reflexes lie in a projection range of the component and if their intensity exceeds that of the light to be projected, then this may have an interfering effect.

U.S. Patent Application Publication No. US 2007/0024549 describes three-dimensional surface structures as inclined windows are described for the avoidance of reflexes, which can be produced in a wafer composite and include glass or plastic as a transparent material.

SUMMARY

The present invention provides a production method for a micromechanical device having inclined optical windows and a micromechanical device having inclined optical windows.

Preferred further refinements of the present invention are described herein.

In accordance with an example embodiment of the present invention, a production method is provided for a micromechanical device which has inclined optical windows in which interfering reflections in a projection range of the device and/or of an optical device, which may be covered by the micromechanical device, are reduced or advantageously avoided, and which has a high optical quality and low production costs.

According to an example embodiment of the present invention, in a first method step S1, a first substrate having a first front side and a first rear side and a second substrate having a second front side and a second rear side are provided in the production method for a micromechanical device having inclined optical windows. In a further method step S2, a plurality of through-holes is produced in the first substrate and in the second substrate such that a congruent through-hole is produced in the second substrate for each through-hole in the first substrate, which overlap when the first substrate is placed over the second substrate, the first rear side facing the second front side. In a further method step S3, a slanted edge region is produced around a respective through-hole in the first substrate and in the second substrate, the edge region laterally encircling a through-hole in each case and being inclined at a window angle in relation to a planar extension of the first substrate and the second substrate, two slanted edge regions disposed on top of each other being congruent in a top view and inclined at the same window angle. In a further method step S4, a window foil having a structured window region is provided, which covers the through-hole and at least partially covers the associated edge region in a top view of the window foil in each case. In a further method step S5, the window foil is positioned between the first rear side of the first substrate and the second front side of the second substrate, the structured window region in each case covering the slanted edge regions and the associated through-holes, and a non-positive connection of the first rear side to the second front side and the interposed window foil takes place by a joining process, the window foil forming an optical window slanted at the window angle above the respective through-hole.

The device advantageously is an optical device, advantageously a micromirror as an optical MEMS (MOEMS). The first and the second substrate may also simply embody an encapsulation, i.e., a cap for an optical MEMS component, and the first and the second substrate may cover the MEMS component. The first and/or the second substrate may advantageously include a plastic or an organic material such as LCP (liquid crystal polymer) or PEEK (polyetheretherketone). In the case of organic materials, significant cost savings over inorganic materials are able to be achieved because they are much more advantageous in their processing and availability. The first and/or the second substrate may be produced by an injection molding process or alternatively also by other methods. The window foil, too, may advantageously include an organic material (such as a transparent foil) and have a high optical quality featuring optical transparency, such as amorphous and/or semi-crystalline plastics, e.g., polyethersulfone (PES), polycarbonate (PC), polyacrylate (PAR), fluorene polyester (FPE), polyethylene terephthalate (PET) or polyethylene napthalate (PEN). The window foil may advantageously also include a thin glass. Appropriate materials are advantageous for the processing to be used and suitable for the operation of the device; for example, suitable materials advantageously do not emit harmful or optically effective outgassing. The first substrate, the second substrate and/or the window foil advantageously result in adequate protection for a MEMS and advantageously constitute an encapsulation for a MEMS component. A further layer such as an optical coating may advantageously be disposed on the optical window. In such an encapsulation, it is possible to dispense with a hermetic encapsulation or hermetic sealing of the MEMS component by the encapsulation (the substrates and the window), which provides great cost advantages. The substrates may also include inorganic materials such as glass or silicon, for example. This device is advantageously able to protect a MEMS component, which may be covered by the micromechanical device with inclined optical windows, from external influences (dust, contact), and the micromechanical device may advantageously form a cavity within which a MEMS component can be placed (both positioned on a wafer, for example). Using thin wires, for instance, the MEMS component is able to be electrically contacted through a through-hole in the first and second substrate with its bond pads. As a result, the micromechanical device may represent a cap wafer for covering a MEMS component on a wafer, be developed individually or developed as a plurality, and adjusted above MEMS components disposed on a wafer, positioned above it and joined. Anodic bonding or direct bonding (also as a joint between glass and silicon free of joining means) via eutectic joining layers as well as via glass solder or glue may advantageously take place.

Precisely one optical window may be allocated to each MEMS component such as a mirror or a chip.

In an advantageous manner, the window angle is selected to be large during the production so that it is sufficient for a deflection of the interfering reflections from the projection direction for the light to be used and suitable for the deflection.

The deflection of possible interfering reflections of boundary surfaces at the window foils is able to be achieved by the inclined position of the optical windows and significantly enhances the effect of the antireflective coatings on the window. The anti-reflective coating is advantageously provided for maximizing a transmission of the window. Due to the fact that a micromirror advantageously included by the MEMS component and able to oscillate in parallel about its neutral position, has only a small clearance from the first or second substrate in small-scale components, the slanted position of the windows advantageously is a simple option for orienting interfering reflections at the boundary surface of the window out of a projection direction (radiation direction). For this purpose, the surface of the optical window and a micromirror are advantageously not situated in parallel with each other.

The example method is advantageously also able to achieve a hermetic encapsulation depending on the type of joint over a MEMS component or its wafer. Furthermore, the present method is advantageously suited to a series production. Scratches or damage to the optical windows during use or during further processing are advantageously able to be avoided or reduced because of the slanted position and the edge regions.

Different windows, which may be placed at a lateral offset from one another, such as those in the first and second substrate, may advantageously have identical window angles or different window angles in each case.

According to one preferred embodiment of the present invention, in method step S4, a trench is formed in the window foil for the through-hole, which laterally encircles the respective through-hole in a top view.

The trench may be stamped into the window foil, for example, or be introduced with the aid of a laser, the trench advantageously fully penetrating the window foil.

According to a preferred embodiment of the present invention, the trench penetrates the window foil outside of holding regions, two holding regions describing an axis of rotation for the through-hole, and in method step S5, the optical window is inclined at the window angle by rotating the window foil about the axis of rotation.

The lateral encircling is advantageously interrupted by the holding regions.

If the window foil is made of glass, then the holding regions may form rated break points in the glass in each case, which can break during the tilting in order to tilt the window. Alternatively, the glass foil may be provided both with trenches and holding regions that are resilient during tilting and do not break, e.g., by laser etching (laser-induced deep etching). Because of the holding regions, the window region advantageously remains in the composite construction of the micromechanical device during processing (e.g., during the tilting or bonding).

According to one preferred specific embodiment of the present method, in method step S5, a joining means (i.e., a joiner) as a bonding material or a glass solder is applied for the connection on the first substrate and/or on the second substrate and/or on the window foil in the slanted edge region.

The joining means is able to be applied to the window foil by screen-printing, for instance. The bonding material may include an organic material such as a thermoplastic or duroplastic bonding agent. Since the first and/or the second substrate and the window foil may also include an inorganic material, this is advantageous for achieving a hermetic seal for the MEMS component, which may be suitable for the use of higher temperatures during the joining process. It is also possible to use hermetically sealing glass solders as joining means.

According to a preferred specific embodiment of the present invention, as a joining means, an inner bonding path encircling the through-hole is situated laterally within the trench in a top view of the window foil, and/or an outer bonding path encircling the through-hole is situated laterally outside the trench.

According to one preferred embodiment of the present invention, in method step S5, a contact pressure is exerted perpendicular to a planar extension of the first substrate on the first substrate and/or the second substrate.

According to one preferred embodiment of the present invention, curing of the joining means takes place during the joining in method step S5.

Depending on the used joining means, the curing may be necessary or can be omitted. Precuring of the joining means may take place prior to the joining operation.

According to one preferred embodiment of the present invention, in method step S4, an anti-reflective material is placed on the window foil on one side or on both sides.

The anti-reflective material is able to be applied to the window foil.

According to an example embodiment of the present invention, the micromechanical device having inclined optical windows has a first substrate having a first front side and a first rear side and a second substrate having a second front side and a second rear side, the first substrate being placed by the first rear side on the second front side on the second substrate, and the first rear side facing the second front side; a plurality of through-holes in the first substrate and in the second substrate, a through-hole in the first substrate overlapping in a congruent fashion with a through-hole in the second substrate. In addition, the device includes a slanted edge region around a respective through-hole in the first substrate and in the second substrate, the edge region laterally encircling a through-hole in each case and being inclined in the first substrate and in the second substrate at a window angle in relation to a planar extension of the first substrate and the second substrate, two slanted edge regions situated on top of each other being congruent in a top view and inclined at the same window angle; and a window foil, which is situated between the first substrate and the second substrate and covers the respective through-hole and forms an optical window inclined at the window angle in the region of the through-hole.

The example device is also advantageously characterized by the features mentioned in connection with the production method and vice versa.

According to one preferred specific embodiment of the device in accordance with the present invention, two slanted edge regions, which are situated on top of each other, are slanted in opposite directions.

In one preferred specific embodiment of the device in accordance with the present invention, a trench is formed in the window foil, which laterally encircles the respective through-hole in the area of the slanted edge regions in a top view.

According to a preferred specific embodiment of the device in accordance with the present invention, an inner bonding path encircling the through-hole is situated as a joining means laterally within the trench in a top view of the window foil and/or an outer bonding path encircling the through-hole is situated laterally outside the trench.

According to one specific embodiment of the device in accordance with the present invention, the first rear side and the second front side in each case include connection structures with the aid of which the first substrate is able to be centered above the second substrate in a predefined position.

The two substrates are advantageously designed so that they are able to have a self-centering effect on top of each other for a precisely determined position when compressed. With the aid of connection structures, such centering is advantageously able to be realized in an automatic and precise manner during the compressing.

According to one preferred specific embodiment of the device in accordance with the present invention, an anti-reflective material is disposed on the window foil on one side or on both sides.

Additional features and advantages of embodiments of the present invention result from the following description with reference to the figures.

BRIEF DESCRIPTION OF THE DRAWINGS

Hereinafter the present invention will be described in greater detail based on the exemplary embodiments illustrated in the schematic figures.

DETAILED DESCRIPTION OF EXAMPLE EMBODIMENTS

The same reference numerals in the figures denote the same or functionally equivalent elements.

Figure 1:
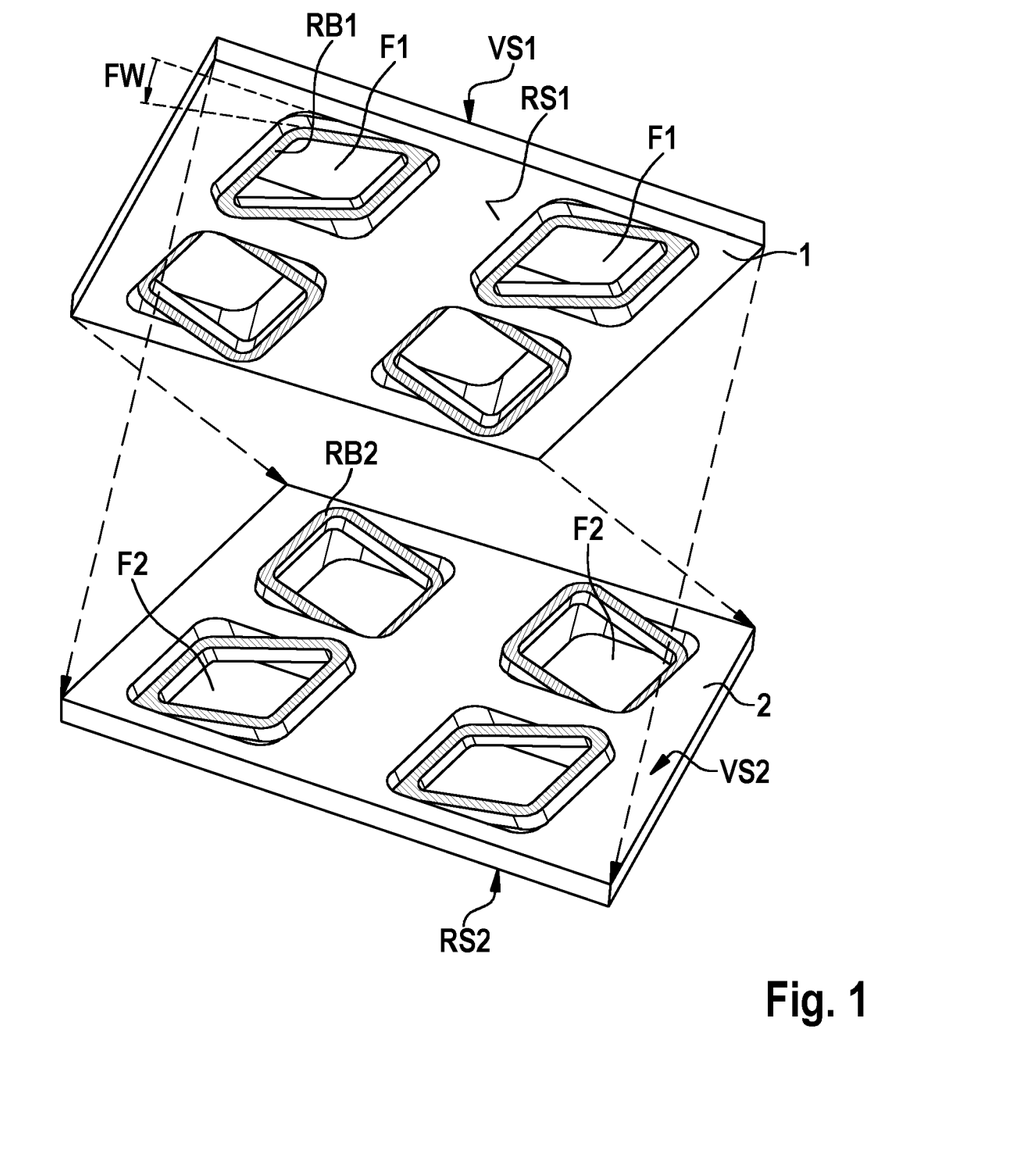
FIG. 1 shows a schematic representation of a first and a second substrate during the production method for a micromechanical device, in accordance with an example embodiment of the present invention.

FIG. 1 shows a schematic illustration of a first and a second substrate during the production method for a micromechanical device, in accordance with an example embodiment of the present invention.

The device includes a plurality of through-holes F1, F2 in first substrate 1 and in second substrate 2, a through-hole F1 in first substrate 1 congruently covering a through-hole F2 in second substrate 2 when placed on top of each other. The substrates include a slanted edge region RB1, RB2 around a respective through-hole F1, F2 in first substrate 1 and in second substrate 2, edge region RB1, RB2 laterally encircling a through-hole F1, F2 and being inclined in first substrate 1 and in second substrate 2 at a window angle FW in relation to a planar extension of first substrate 1 and second substrate 2, two slanted edge regions RB1, RB2 situated on top of each other being congruent in a top view and inclined at the same window angle FW in each case. In an advantageous manner, an edge region RB1 represents the mating piece to other edge region RB2 of the associated through-hole required for the placement on top. First substrate 1 and second substrate 2 are advantageously placed on top of each other according to the depicted arrow in FIG. 1, a first rear side RS1 being placed on a second front side VS2.

Edge region RB1, RB2 in the first and in the second substrate is advantageously raised in a subregion in relation to the planar extension of the substrate and recessed in another subregion. The raised regions in first substrate 1 advantageously fit precisely into the recessed subregions of second substrate 2, and vice versa.

Figure 2:
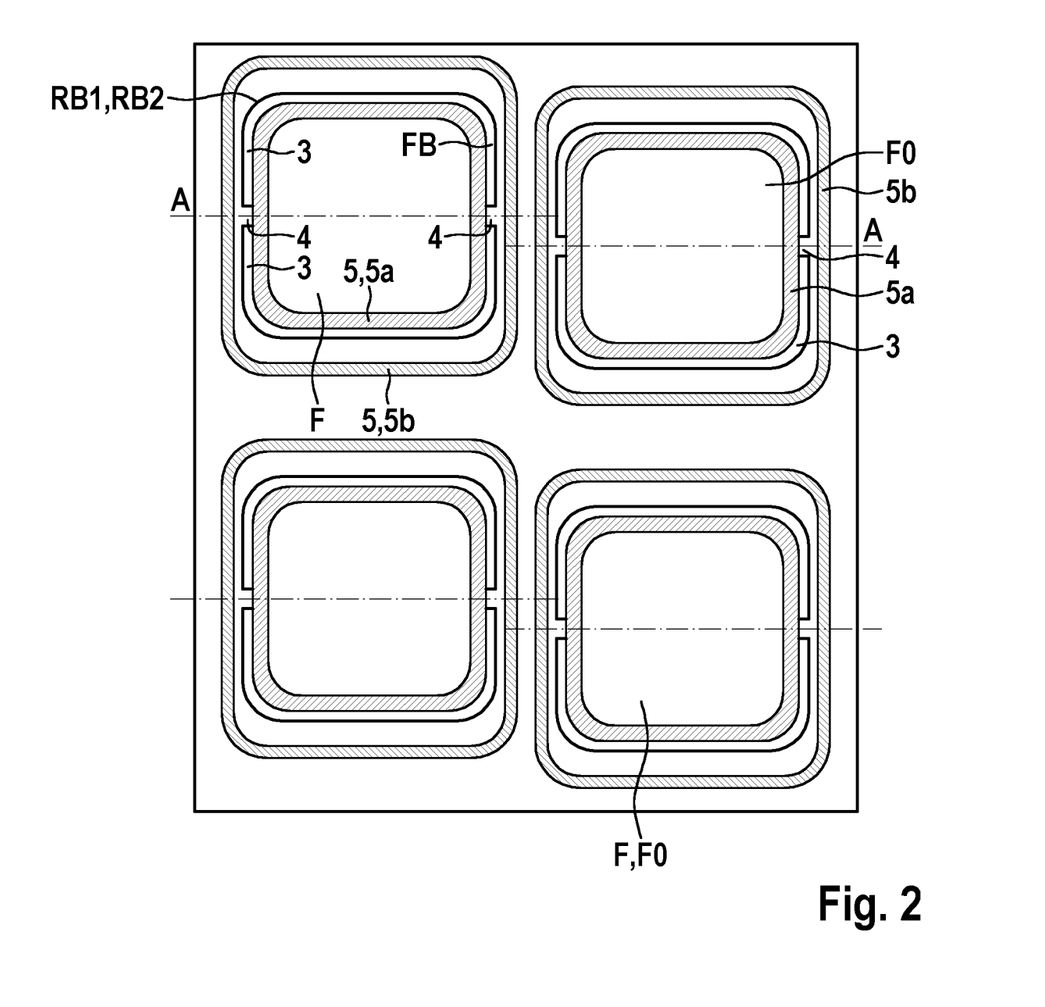
FIG. 2 shows a schematic top view of a window foil for a device according to an example embodiment of the present invention.

FIG. 2 shows a schematic top view of a window foil for a device according to the present invention.

Window foil FO of the device is provided with structuring, which may include a trench 3 in window region FB. This trench 3 encircles the region of the through-hole above which window foil FO is positioned in the course of the method laterally on an outer side and advantageously in the region of slanted edge regions RB1 and RB2. The lateral encircling by trench 3 may be interrupted at holding regions 4.

Window foil FO may include two holding regions 4 for a through-hole or for each through-hole in both substrates, which subdivide trench 3 into two regions. In an advantageous manner, holding regions 4 define an axis of rotation A. When placing the two substrates on top of each other together with interposed window foil FO, the optical window may be positioned at a slant, and when placed on the slanted edge regions RB1 and RB2, they are able to incline optical window F at the window angle by rotating window foil FO about axis of rotation A.

A joining means 5 as a bonding material or a glass solder may be disposed on window foil FO or on one of the substrates in edge region RB1 and RB2.

In a top view of window foil FO, joining means 5 may form an inner bonding path 5a encircling the through-hole laterally within trench 3 and/or an outer bonding path 5b encircling the through-hole laterally outside of trench 3. The through-hole may correspond to a position of a chip as a MEMS component on a wafer so that outer bonding path 5b may correspond to an outer contour of the chip. Outer bonding path 5b is advantageously used for sealing the interior region, i.e. the MEMS components, from the outside, for example as protection against water from sawing during the singulation of the wafer.

By curing the joining means, the tilted state of the window and the composite substrates is advantageously able to be assumed on a permanent basis. When glass solder is used, the solder can soften at high temperatures, wet the joining elements (substrate and window foil) and result in a firm, hermetic connection after cooling.

Adjacent windows F may be situated at a mutual offset from one another or in the same line in a top view of the substrate.

Figure 3:
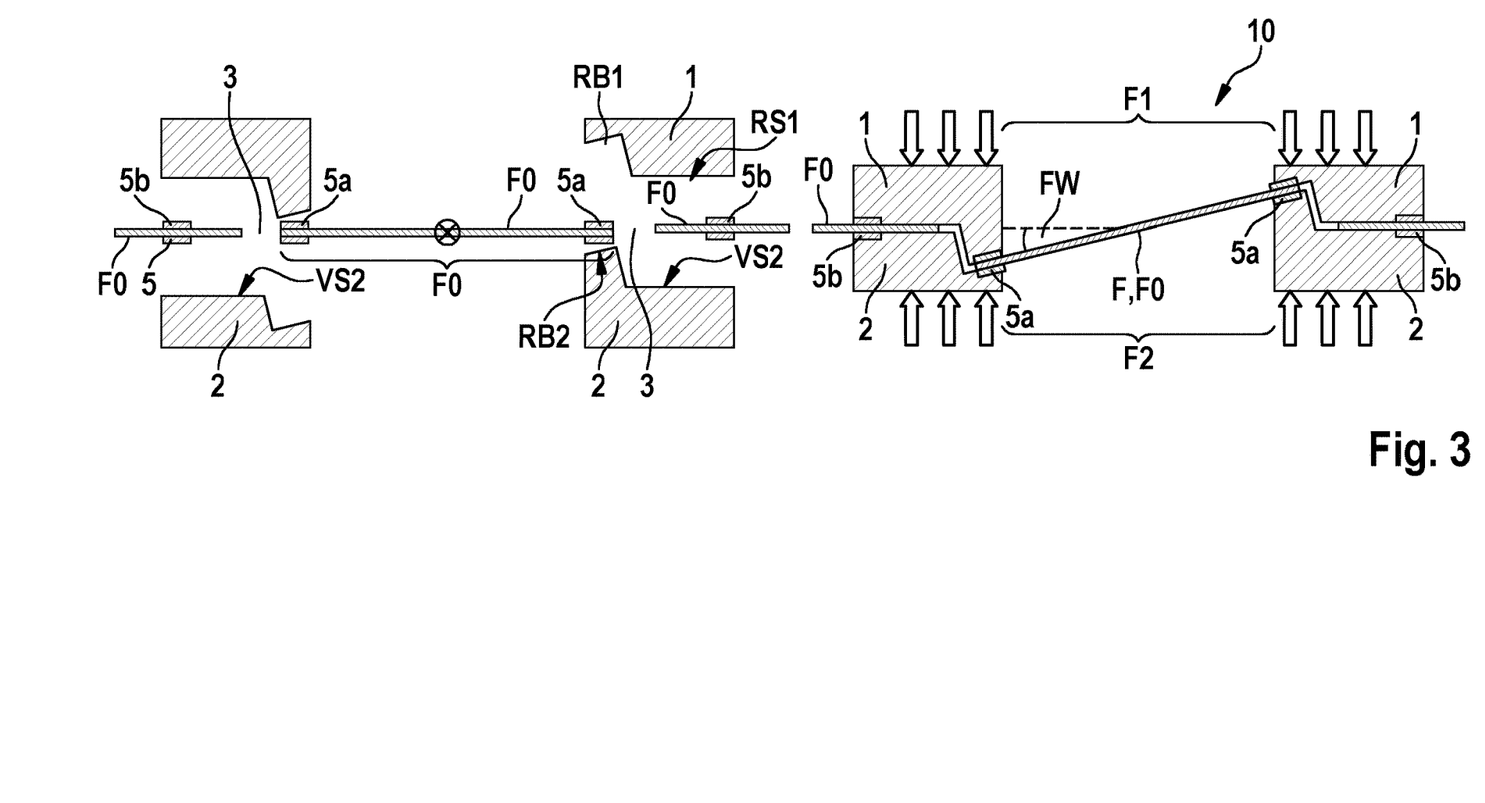
FIG. 3 shows a schematic side view of a sequence of the production method and the device according to an exemplary embodiment of the present invention.

FIG. 3 shows a schematic side view of a sequence of the production method and of the device according to a specific embodiment of the present invention.

The left image of FIG. 3 shows a positioning of window foil FO in a cross-section between first substrate 1 and second substrate 2. In this instance, window foil FO is shown with trench 3 in the area of edge regions RB1 and RB2. Outside trench 3, joining means 5 is shown as outer bonding path 5b and as inner bonding path 5a advantageously on both sides of window foil FO.

Finished device 10 is shown in a cross-section in the right image.

A micromechanical device 10 having inclined optical windows F includes a first substrate 1 having a first front side VS1 and a first rear side RS1 and a second substrate 2 having a second front side VS2 and a second rear side RS2, first substrate 1 being situated by first rear side RS1 on second front side VS2 on second substrate 2, first rear side RS1 facing second front side VS2.

Window foil FO, which is disposed between first substrate 1 and second substrate 2 and covers the respective through-hole F1, F2, may form an optical window F slanted at window angle FW in the region of through-hole F1, F2. The two substrates are able to be pressed against each other by a contact pressure (shown by arrow), which may lead to tilting and securing of the optical window at edge regions RB1 and RB2 during the pressure application.

Since the window foil(s) is/are situated within the two stacked substrates, it/they are able to be protected from mechanical contact during the further processing of the device, which can lead to defects and scratches.

Figure 4:
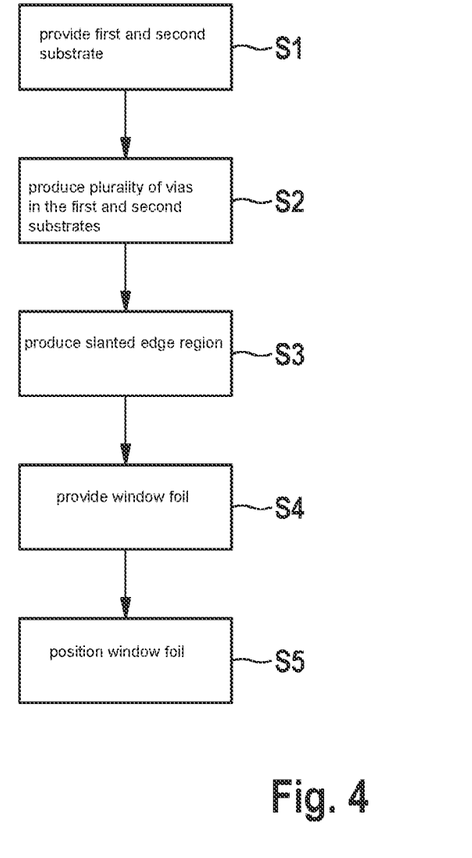
FIG. 4 shows a schematic representation of a sequence of method steps according to an exemplary embodiment of the present invention.

FIG. 4 shows a schematic representation of a sequence of method steps according to an exemplary embodiment of the present invention.

In the production method for a micromechanical device having inclined optical windows, in a method step S1 a first substrate having a first front side and a first rear side and a second substrate having a second front side and a second rear side are provided; in a method step S2, a plurality of through-holes is produced in the first substrate and in the second substrate such that for every through-hole in the first substrate a congruent through-hole is produced in the second substrate, which overlap when the first substrate is placed over the second substrate, the first rear side facing the second front side. In a method step S3, a slanted edge region is provided around a respective through-hole in the first substrate and in the second substrate, the edge region laterally encircling a through-hole and being inclined at a window angle in relation to a planar extension of the first substrate and the second substrate, two slanted edge regions situated on top of each other being congruent in a top view and being inclined at the same window angle. In a method step S3, a window foil having a structured window region is provided, which covers the through-hole and at least partially covers the associated edge region in a top view of the window foil; and in a method step S5, the window foil is positioned between the first rear side of the first substrate and the second front side of the second substrate, the structured window region covering the slanted edge regions and the associated through-holes, and the first rear side is connected in a nonpositive manner to the second front side and the interposed window foil by a joining process, the window foil forming an optical window slanted at the window angle above the respective through-hole. The method may be carried out in the described sequence but the mentioned method steps are also able to be carried out in a different sequence.

Although the present invention has been described above based on preferred exemplary embodiments, it is not restricted thereto but may be modified in many ways.

The invention claimed is:

1. A production method for a micromechanical device having inclined optical windows, the method comprising the following steps:
   S1) providing a first substrate having a first front side and a first rear side and a second substrate having a second front side and a second rear side;
   S2) producing a plurality of through-holes in the first substrate and in the second substrate such that a congruent through-hole is produced in the second substrate for each of the through-holes in the first substrate, which overlap when the first substrate is placed above the second substrate, the first rear side facing the second front side;
   S3) producing a slanted edge region around each respective through-hole of the through-holes in the first substrate and in the second substrate, the edge region laterally encircling the respective through-hole in each case and being inclined at a window angle in relation to a planar extension of the first substrate and the second substrate, wherein two of the slanted edge regions of the first and second substrate, disposed on top of each other when the first substrate is placed above the second substrate, are congruent in a top view and inclined at the same window angle;
   S4) providing a window foil having a structured window region, which covers each of the respective through-holes and at least partially covers the edge regions in a top view of the window foil in each case; and
   S5) interposing the window foil between the first rear side of the first substrate and the second front side of the second substrate, the structured window region in each case covering the slanted edge regions and the respective through-holes, and connecting the first rear side in a nonpositive manner to the second front side and the interposed window foil by a joining process, the window foil forming a respective optical window slanted at the window angle above each of the respective through-holes.

2. The production method as recited in claim 1, wherein a respective trench is formed in the window foil for each of the respective through-holes in method step S4, which laterally encircles the respective through-hole in a top view.

3. The production method as recited in claim 2, wherein the respective trenches penetrate the window foil outside holding regions, two holding regions of the holding regions defining an axis of rotation for the each respective through-hole, and in method step S5, each of the respective optical windows is inclined at the window angle by rotating the window foil about the axis of rotation.

4. The production method as recited in claim 3, wherein in method step S5, a bonding material or a glass solder is applied for a connection in the slanted edge regions on the first substrate and/or on the second substrate and/or on the window foil.

5. The production method as recited in claim 4, wherein as a joiner, an inner bonding path encircling each of the respective through-holes is situated laterally within the each of the respective trenches in a top view of the window foil and/or a respective outer bonding path encircling each of the respective through-holes is situated laterally outside the respective trenches.

6. The production method as recited in claim 1, wherein in method step S5, a contact pressure is exerted perpendicular to a planar extension of the first substrate on the first substrate and/or on the second substrate.

7. The production method as recited in claim 5, wherein curing of the bonding material or the glass solder takes place during the joining in method step S5.

8. The production method as recited in claim 1, wherein in method step S4, an anti-reflective material is placed on the window foil on one side or on both sides of the window foil.

9. A micromechanical device having inclined optical windows, comprising:
   a first substrate having a first front side and a first rear side and a second substrate having a second front side and a second rear side, the first substrate being situated with the first rear side on the second front side on the second substrate, the first rear side facing the second front side;
   a plurality of through-holes in the first substrate and in the second substrate, each through-hole of the through-holes in the first substrate congruently overlapping with a through-hole of the through-holes in the second substrate in each case;

a slanted edge region situated around each respective through-hole of the through-holes in the first substrate and in the second substrate, each of the edge regions laterally encircling the respective through-hole in each case and being inclined in the first substrate and in the second substrate at a window angle in relation to a planar extension of the first substrate and the second substrate, two slanted edge regions of the edges regions situated on top of each other being congruent in a top view and inclined at the same window angle; and a window foil situated between the first substrate and the second substrate and covers each respective through-hole and forms an optical window inclined at the window angle in an area of the respective through-hole.

10. The micromechanical device as recited in claim 9, wherein the two slanted edge regions situated on top of each other are slanted in opposite directions.

11. The micromechanical device as recited in claim 9, wherein the window foil includes a trench formed in the window foil which laterally encircles the respective through-holes in an area of the slanted edge regions in a top view.

12. The micromechanical device as recited in claim 11, in which as a joiner, an inner bonding path encircles the respective through-holes is situated laterally within the trenches in a top view of the window foil and/or an outer bonding path encircling the respective through-holes is laterally situated outside the trenches.

13. The micromechanical device as recited in claim 9, wherein the first rear side and the second front side each include connection structures using which the first substrate is centered above the second substrate in a predefined position.

14. The micromechanical device as recited in claim 9, wherein an anti-reflective material is disposed on the window foil on one side or on both sides of the window foil.

* * * * *